US009588186B2

(12) United States Patent
Arnold et al.

(10) Patent No.: US 9,588,186 B2
(45) Date of Patent: Mar. 7, 2017

(54) MECHANICAL MEASUREMENT OF STATE OF HEALTH AND STATE OF CHARGE FOR INTERCALATION BATTERIES

(71) Applicants: Craig B. Arnold, Princeton, NJ (US); John Cannarella, Wayne, NJ (US)

(72) Inventors: Craig B. Arnold, Princeton, NJ (US); John Cannarella, Wayne, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 534 days.

(21) Appl. No.: 14/052,668

(22) Filed: Oct. 11, 2013

(65) Prior Publication Data
US 2014/0107949 A1 Apr. 17, 2014

Related U.S. Application Data

(60) Provisional application No. 61/712,316, filed on Oct. 11, 2012.

(51) Int. Cl.
*G01R 31/36* (2006.01)
*G01L 5/00* (2006.01)

(52) U.S. Cl.
CPC .......... *G01R 31/3679* (2013.01); *G01L 5/00* (2013.01); *G01R 31/3606* (2013.01); *G01R 31/3651* (2013.01)

(58) Field of Classification Search
USPC ........................................................ 702/42
See application file for complete search history.

(56) References Cited

U.S. PATENT DOCUMENTS

| 2012/0286739 | A1* | 11/2012 | O'Brien, Jr. ........ | H01M 2/1077 320/134 |
| 2013/0122332 | A1* | 5/2013 | van Lammeren . | H01M 10/4257 429/61 |
| 2013/0323554 | A1 | 12/2013 | Heubner et al. | |
| 2014/0092375 | A1* | 4/2014 | Raghavan ............... | G01L 1/246 356/32 |

FOREIGN PATENT DOCUMENTS

DE 10 2012 209 271 * 12/2013 ............ H01M 10/48

OTHER PUBLICATIONS

Venkatasailanathan Ramadesigan, Modeling and Simulation of Lithium-Ion Batteries from a Systems Engineering Perspective, Jan. 26, 2012, Journal of the Electrochemical Society, 159 (3) R31-R45 (2012).*

* cited by examiner

*Primary Examiner* — Tung Lau
(74) *Attorney, Agent, or Firm* — Meager Emanuel Laks Goldberg & Liao, LLP

(57) ABSTRACT

A battery management system for use with a battery under test is disclosed. The system includes a container configured to hold the battery. The system also includes a stress/strain sensor. The container is configured to hold the battery in fixed relationship with respect to the stress/strain sensor. A processor is coupled to the stress/strain sensor, the processor being configured to measure the stress/strain on the battery and determine the state of health (SOH) of the battery based on the measured stress/strain and previously stored SOH relationship data for the battery. The processor may be configured to determine a state of charge (SOC) of the battery based on the measured stress/strain, the SOH of the battery and previously stored SOC relationship data for the battery.

18 Claims, 4 Drawing Sheets

MECHANICAL MEASUREMENT OF STATE OF HEALTH AND STATE OF CHARGE FOR INTERCALATION BATTERIES

CROSS-REFERENCE TO PRIOR FILED APPLICATIONS

This application claims priority to U.S. provisional application 61/712,316 which was filed on Oct. 11, 2012 which is incorporated herein in its entirety.

TECHNICAL FIELD

This invention relates generally to a systems and methods measuring the state of charge and state of health of batteries.

BACKGROUND

The determination of a battery's state of charge (SOC) and state of health (SOH) are important for the power management of any system that relies on batteries as a power source, e.g. cell phones, laptops, electric vehicles, grid level storage and the like. Despite its fundamental importance in battery systems, SOC and SOH measurements are not straightforward and remain an area of active research.

To date, the state of charge of lithium-ion batteries is estimated either by cell voltage, coulomb counting, or a combination of both methods. Voltage-based SOC measurements are relatively imprecise because voltage is somewhat insensitive to SOC in commercial lithium-ion chemistries. Voltage is also dependent on a number of factors such as temperature and electric current. Coulomb counting is a technique which relies on measuring the amount of charge entering and leaving a battery to determine the battery's state of charge. This technique builds up errors over time and is mathematically intensive. This type of measurement scheme requires periodic recalibration through a controlled full charge and discharge cycle to maintain accuracy and the current measurement results in a small power loss. Furthermore, this method cannot account for SOC change due to self-discharge.

The state of health of a battery cell is typically measured by fully charging and then fully discharging the battery cell using a controlled testing protocol in a controlled environment to determine its remaining charge storage capacity. This technique is unsuitable for consumer applications as it is difficult to create suitable conditions for a controlled capacity measurement outside of a laboratory setting. In addition, a controlled capacity measurement requires the battery cell to be offline for the duration of the measurement, which generally takes many hours to complete. For these reasons, determination of a battery cell's SOH is an active area of research. Typical approaches attempt to correlate conventionally measured battery parameters (voltage, current, temperature, SOC, etc.) to SOH. Another actively investigated approach is to correlate measurements of AC impedance to SOH, which requires the addition of an impedance measurement system. Both approaches rely on complicated models and generally exhibit limited accuracy in determining SOH. Improved systems and methods for determining SOC/SOH are desirable.

SUMMARY OF THE INVENTION

A battery management system for use with a battery under test is disclosed. The system includes a container configured to hold the battery. The system also includes a stress/strain sensor. The container is configured to hold the battery in fixed relationship with respect to the stress/strain sensor. A processor is coupled to the stress/strain sensor, the processor being configured to measure the stress/strain on the battery and determine the state of health (SOH) of the battery based on the measured stress/strain and previously stored SOH relationship data for the battery. The SOH relationship data may include the relationship between peak stress/strain and SOH of the battery. The SOH relationship data may be represented by a linear approximation or non-linear approximation.

The processor may be configured to determine a state of charge (SOC) of the battery based on the measured stress/strain, the SOH of the battery and previously stored SOC relationship data for the battery. The SOC relationship data may include the relationship between measured stress/strain, SOC and SOH. The SOC relationship data may be represented by a linear approximation or non-linear approximation. The container may be formed separately from the battery. The battery may be formed with packaging that comprises the container and the stress/strain sensor may be disposed within the packaging.

A method for managing a battery is also disclosed. The method includes providing a container configured to hold the battery and a stress/strain sensor. The container is configured to hold the battery in fixed relationship with respect to the stress/strain sensor. The method also includes providing a processor coupled to the stress/strain sensor, the processor being configured to measure the stress/strain on the battery and determine the state of health (SOH) of the battery based on the measured stress/strain and previously stored SOH relationship data for the battery. The SOH relationship data may include the relationship between peak stress/strain and SOH of the battery. The SOH relationship data may be represented by a linear approximation or non-linear approximation.

The processor may be configured to determine a state of charge (SOC) of the battery based on the measured stress/strain, the SOH of the battery and previously stored SOC relationship data for the battery. The SOC relationship data may include the relationship between measured stress/strain, SOC and SOH. The SOC relationship data may be represented by a linear approximation or non-linear approximation. The container may be formed separately from the battery. The battery may be formed with packaging that comprises the container and the stress/strain sensor may be disposed within the packaging.

A computer readable medium containing program instructions for managing a battery is also disclosed, wherein execution of the program instructions by one or more processors of a computer system causes the one or more processors to carry out the steps of measuring stress/strain in the battery and determining the state of health (SOH) of the battery based on the measured stress/strain and previously stored SOH relationship data for the battery. The SOH relationship data may include the relationship between peak stress/strain and SOH of the battery. The SOH relationship data may be represented by a linear approximation or non-linear approximation.

A state of charge (SOC) of the battery may be determined based on the measured stress/strain, the SOH of the battery and previously stored SOC relationship data for the battery. The SOC relationship data may include the relationship between measured stress/strain, SOC and SOH. The SOC relationship data may be represented by a linear approximation or non-linear approximation. The battery may have a container that is formed separately from the battery. The battery may be formed with packaging that comprises a container and the stress/strain sensor may be disposed within the packaging.

BRIEF DESCRIPTION OF THE FIGURES

FIG. 2b is a more detailed graph showing the stress vs. cycle number for cycles 950-953 as highlighted in FIG. 2a.

DETAILED DESCRIPTION

Figure 1:
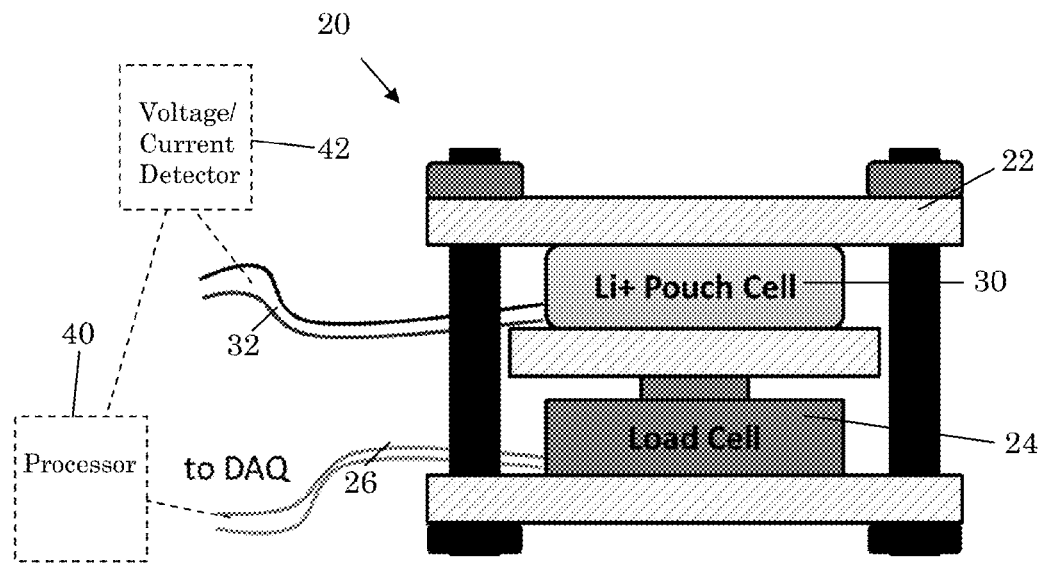
FIG. 1 is a block diagram of a test fixture.

Disclosed is a system and method of determining SOC and SOH from simple measurements of mechanical battery or cell expansion, which varies predictably with SOC and SOH. Mechanical measurements are particularly attractive because stress/strain is a cell parameter that is relatively sensitive to SOC/SOH and insensitive to factors such as current. This is in contrast to cell voltage which is relatively insensitive to SOC and strongly affected by factors such as electric current and temperature. Mechanical measurements can be used to compliment or even replace battery management systems based on more complicated dynamic system models and charge counting algorithms, resulting in higher battery pack performance and longevity. The disclosed approach can be used to measure the state of charge and health of any battery that exhibits predictable degradation-induced stress/strain behavior, for example, lithium-ion cells in electric vehicles.

Mechanical measurements of cell expansion can be classified into two general categories: measurements of stress and measurements of strain. A stress measurement measures a mechanical stress that is exerted when a battery cell expands against a mechanical constraint. The resulting stress can be related to cell expansion through appropriate mechanical models of the mechanical behavior of the cell. Alternatively, this measured stress can be related directly to SOC/SOH, as both SOC and SOH are directly related to cell expansion. Stress measurements can be made using a load cell appropriately placed in a constraint with the electrodes or packaging of the cell under consideration. A strain measurement measures cell expansion by directly measuring the change in thickness of a cell. This measurement can be made by using a strain gauge appropriately placed in a constraint with the electrodes or packaging of the cell under consideration. This strain measurement can then be related to SOC/SOH.

Mechanical stress (or strain) is much more sensitive to the SOC of lithium-ion battery cells than traditional approaches. Mechanical stress (or strain) can be used to measure the SOC of the system with little need for mathematical computation. Mechanically-based SOC measurements are able to account for SOC change due to self-discharge.

Once a system for measuring cell expansion, either through a stress or strain measurement, is selected, it is necessary to distinguish between reversible and irreversible expansion. Irreversible expansion can be distinguished from reversible expansion by comparing expansion measurements of a cell that is in a known state at different times. For example, comparison of the expansion of a cell at 100% SOC at a later time to the expansion of a cell at 100% SOC at an earlier time results in a measurement of a change in irreversible expansion. Determination of the aforementioned known battery states requires measurement of other battery parameters that are typically measured during normal battery operation, namely voltage and current. While these parameters alone are generally poor indicators of a cell's state, they can be used to effectively determine certain specific battery states. For example, most batteries have upper and lower voltage limits that are used to determine ~100% SOC and ~0% SOC, respectively. A battery is at ~100% SOC when the battery is at its upper voltage limit. Similarly at ~0% SOC when the battery is at its lower voltage limit. It should be understood that the voltage cutoffs may be set at a wide range of values between 0% and 100% without departing from the scope of this disclosure. Generally SOC may be thought of as the equivalent of a fuel gauge for the battery pack, e.g., (0%=empty; 100%=full). It should also be understood that the 0% and 100% SOC values may not correspond identically with the electrochemical limits of the battery, e.g., to protect the battery from excessive charging and/or discharging. When the voltage of a battery cell is at one of these predetermined voltage limits and no current is being drawn from the battery cell, the cell is at a known state. During normal operation, battery cells are typically not allowed to exceed these limits, making them useful states that would occur frequently enough to provide up to date measures of irreversible expansion.

FIG. 1 is a block diagram of a battery management system 20. The battery management system 20 includes a rigid container 22 and a load cell or stress/strain sensor 24. The term stress/strain sensor as used herein encompasses stress sensors, strain sensors and any other sensors that measure force or displacement. A battery 30 under test is placed in the rigid container 22. In this example, the battery 30 is a Lithium-ion pouch cell. It should be understood that other battery configurations and chemistries may be used without departing from the scope of this disclosure. It should be also understood that the rigid container may be separate from the battery as shown in FIG. 1 but may also be integrated into the battery packaging or cell canister. It should also be understood that battery leads 32 may be coupled to measuring circuitry such as a voltage/current sensor e.g. ammeter, voltmeter as shown by block 42 as is well known in the art. The output of the voltage/current sensor 42 is coupled to processor 40. It should be understood that processor 40 is coupled to suitable memory and input/output circuitry as is well known in the art. Similarly, the load cell output leads 26 may be coupled to digital acquisition circuitry and ultimately processor 40.

In this example an initial stress of 0.05 MPa is applied to the battery 30 prior to closing the fixture 20. Also in this example, the battery 30 is charged at C/2 rate and then discharged at a C/2 rate (cycle). It should be understood that a variety of initial stress levels may be used. It should also be understood that the techniques disclosed herein are suitable for uses with a wide range of charge/discharge rates. As the battery's electrodes expand during charge and discharge, the stress/strain on the battery 30 is measured with the stress/strain sensor 24 and then converted to a SOH/SOC value.

Figure 2A:
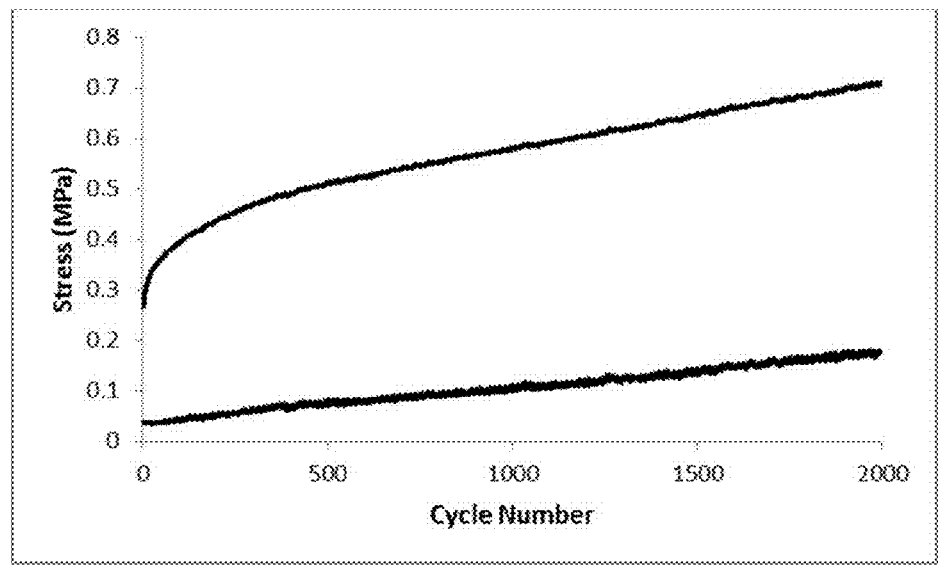
FIG. 2a is a graph showing the stress vs. cycle number.
Figure 2B:
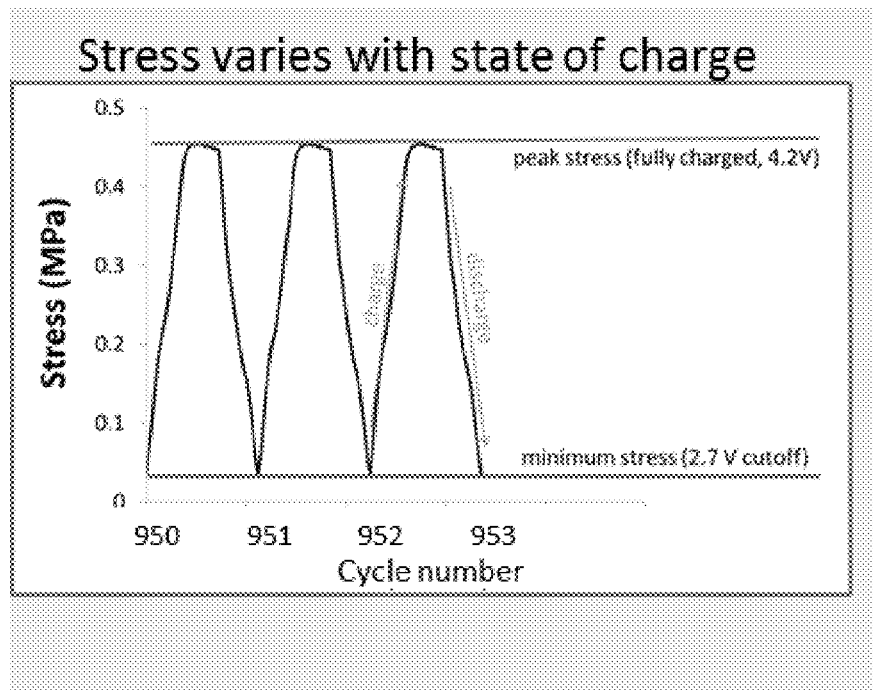

FIG. 2a is a graph showing the stress on a battery vs. cycle number. FIG. 2b is a more detailed graph showing the stress vs. cycle number for cycles 950-953 as highlighted in FIG. 2a. FIGS. 2a and 2b show that as a lithium-ion battery is cycled cell, i) the stress increases over many cycles (FIG. 2a) and ii) stress varies with state of charge (FIG. 2b).

Figure 3:
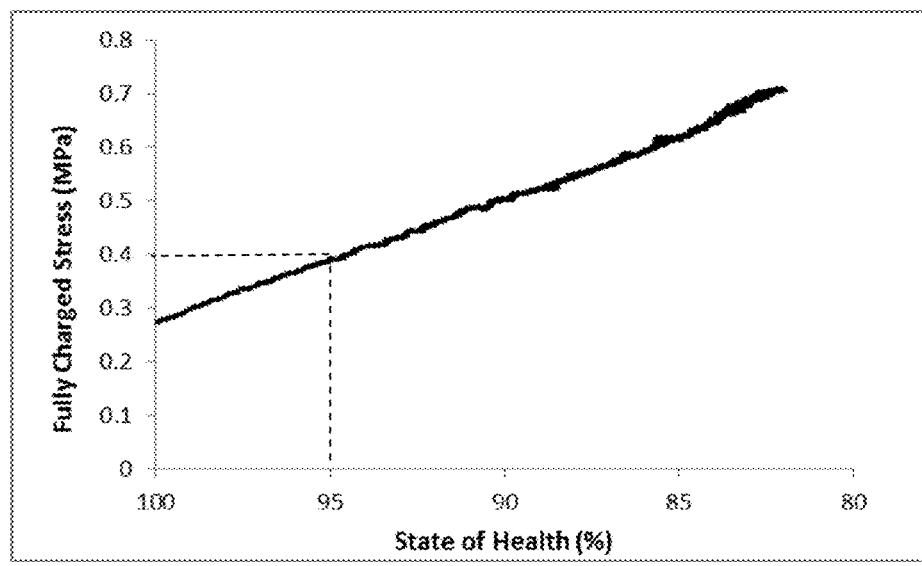
FIG. 3 is a graph showing stress vs. capacity loss.

The measured stress may be used to determine the state of health (SOH) of the battery, e.g., measured as a percentage of the initial storage capacity of the battery. FIG. 3 is a graph showing stress vs. SOH (SOH relationship data). It should be understood that SOH relationship data may be represented by a linear approximation or non-linear approximation. FIG. 3 shows that it is possible to determine battery capacity without having to fully discharge the battery under test. Each time the battery is charged, a peak stress may be recorded. It should be understood that conventional methods may be used to determine when the battery is fully charged, e.g., at the upper voltage cutoff. The peak stress generally increases as the battery is cycled. The processor is configured to determine the SOH based on the measured peak stress and the SOH relationship data for the battery under test. The processor may include a look up table with the SOH relationship data so that a fully charged (peak) stress level may be correlated to a SOH value. It should be understood that the SOH may be expressed in % capacity loss or as a percentage of the initial storage capacity of the battery. In this example if a battery has a fully charged (peak) stress (100% SOC) of 0.40 Mpa, the SOH would be 95% as shown in FIG. 3. In the alternative, the SOH relationship data may be represented as a formula for a line or complex curve. The processor may be configured to calculate the X value (e.g., SOH) based on the Y value (measured stress). Implementation of such functions is well within the grasp of an ordinary person having skill in the art.

The SOH relationship data may be determined by a variety of methods. For example the SOH relationship data may be determined experimentally by testing a sample battery of the desired chemistry and mechanical configuration. The sample battery is subjected to repeated charge/discharge cycles at a suitable charge/discharge rate. The sample battery voltage, current and stress levels are recorded to develop the peak stress vs. capacity relationship as shown in FIG. 3. It should be understood that the SOH relationship data may derived at a reduced SOC, e.g., 50% charged. In this case all "peak" SOH readings would then be carried out at the reduced SOC levels. In the alternative, the SOH relationship data may be developed using mathematical models for the sample battery. The SOH relationship data for the sample battery is then used for subsequent batteries of the same chemistry and configuration, e.g., batteries from the same manufacturer having the same part number or from the same product family.

Figure 4:
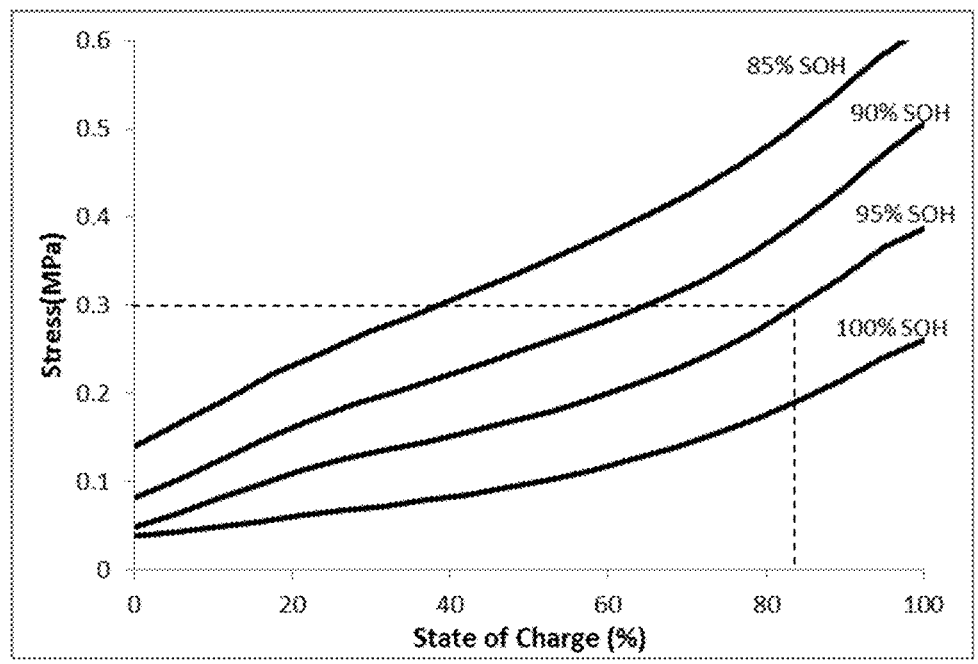
FIG. 4 is a graph showing a set of stress vs. state of charge based on the state of health of the battery under test.

FIG. 4 is a graph showing a set of stress vs. SOC (SOC relationship data) based on the state of health of the battery under test. It should be understood that SOC relationship data may be represented by a linear approximation or non-linear approximation. In this example, the stress on the Lithium-ion pouch cell under test is approximately linear with SOC. It should be understood that other batteries may exhibit other curves that are that are more complex. The SOC curve depends on the SOH for the battery under test. Once the SOH of the battery is determined, e.g. as disclosed above, the proper stress v. SOC curve may be selected. For example, referring to FIG. 4, if a battery under test has a SOH of 95% and a measured stress of 0.3 Mpa is recorded, the battery has a SOC of 83%.

The SOC relationship data may be determined by a variety of methods similar to the SOH relationship data discussed above. For example the SOC relationship data may be determined experimentally by testing a sample battery of the desired chemistry and mechanical configuration. The sample battery is subjected to repeated charge/discharge cycles at a suitable charge/discharge rate. The sample battery voltage, current and stress levels are recorded to develop the stress vs. SOC relationship as shown in FIG. 4. In the alternative, the SOC relationship data may be developed using mathematical models for the sample battery. The SOC relationship data for the sample battery is then used for subsequent batteries of the same chemistry and configuration, e.g., batteries from the same manufacturer having the same part number or from the same product family.

Figure 5:
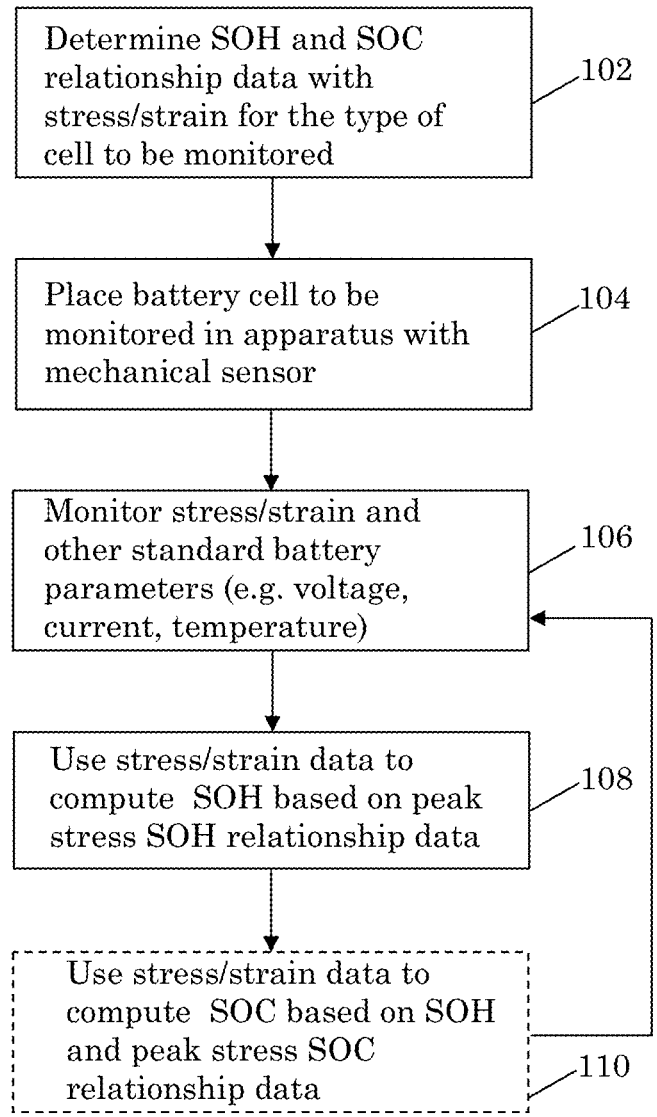
FIG. 5 is a flow chart showing a more detailed operation of a stress-based battery management system.

FIG. 5 is a flow chart showing a more detailed operation of a stress-based battery management system. It should be understood that any flowcharts contained herein are illustrative only and that other program entry and exit points, time out functions, error checking routines and the like (not shown) may be implemented in a typical system. It is also understood that system software may run continuously after being launched. Accordingly, any beginning and ending blocks are intended to indicate logical beginning and ending points of a portion of logic. The order of execution of any of the blocks may also be varied without departing from the scope of this disclosure. Implementation of these aspects is readily apparent and well within the grasp of those skilled in the art based on the disclosure herein.

In this example, the system is provided with the SOH and SOC relationship data for a given battery as shown by block 102. SOH and SOC relationship data may be stored as a look up table or may be implemented with a mathematical formula for the applicable curve(s) for the battery under test. The battery under test is placed in a rigid container with a sensor configured to measure stress/strain of the battery as shown by block 104 and as discussed in connection with FIG. 1. In operation, stress/strain on the battery is monitored along with other standard battery parameters (e.g. voltage, current, temperature) as shown by block 106. The processor is configured to determine the SOH based on the measured stress/strain and the SOH relationship data as shown by block 108 and as discussed in detail above. The processor may also be configured to determine the SOC of the battery using the measured stress/strain and the previously determined SOH of the battery and the SOC relationship data as shown by block 110 and as discussed in detail above. The process shown in blocks 106-110 may be repeated as shown.

It should be understood that many variations of the battery management system are possible based on the disclosure herein. Although features and elements are described above in particular combinations, each feature or element can be used alone without the other features and elements or in various combinations with or without other features and elements. The methods or flow charts provided herein may be implemented in a computer program, software, or firmware incorporated in a non-transitory computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A battery management system for use with a battery under test, the system comprising:
   a rigid container configured to hold the battery, the rigid container having a pair of opposed plates disposed in a fixed relationship;

a mechanical stress/strain sensor, wherein the rigid container is configured to hold the battery and the stress/strain sensor between the pair of opposed plates; and a processor coupled to the stress/strain sensor, the processor being configured to measure the stress/strain on the battery and determine the state of health (SOH) of the battery based on the measured stress/strain and previously stored SOH relationship data for the battery.

2. The battery management system of claim 1 wherein the SOH relationship data includes the relationship between peak stress/strain and SOH of the battery.

3. The battery management system of claim 1 wherein the SOH relationship data may be represented by a linear approximation or non-linear approximation.

4. The battery management system of claim 1 wherein the processor is configured to determine a state of charge (SOC) of the battery based on the measured stress/strain, the SOH of the battery and previously stored SOC relationship data for the battery.

5. The battery management system of claim 4 wherein the SOC relationship data may be represented by a linear approximation or non-linear approximation.

6. The battery management system of claim 4 wherein the SOC relationship data includes the relationship between measured stress/strain, SOC and SOH.

7. A method for managing a battery, the method comprising:
providing a rigid container configured to hold the battery, the rigid container having a pair of opposed plates disposed in a fixed relationship;
providing a mechanical stress/strain sensor, wherein the rigid container is configured to hold the battery and the stress/strain sensor between the pair of opposed plates; and
providing a processor coupled to the stress/strain sensor, the processor being configured to measure the stress/strain on the battery and determine the state of health (SOH) of the battery based on the measured stress/strain and previously stored SOH relationship data for the battery.

8. The method of claim 7 wherein the SOH relationship data includes the relationship between peak stress/strain and SOH of the battery.

9. The method of claim 7 wherein the SOH relationship data is represented by a linear approximation or non-linear approximation.

10. The method of claim 7 wherein the processor is configured to determine a state of charge (SOC) of the battery based on the measured stress/strain, the SOH of the battery and previously stored SOC relationship data for the battery.

11. The method of claim 10 wherein the SOC relationship data includes the relationship between measured stress/strain, SOC and SOH.

12. The method of claim 10 wherein the SOC relationship data is represented by a linear approximation or non-linear approximation.

13. A non-transitory computer readable medium containing program instructions for managing a battery, wherein execution of the program instructions by one or more processors of a computer system causes the one or more processors to carry out the steps of:
measuring stress/strain in the battery and determining the state of health (SOH) of the battery based on the measured stress/strain and previously stored SOH relationship data for the battery, the battery being disposed in a rigid container configured to hold the battery, the rigid container having a pair of opposed plates disposed in a fixed relationship, the container being configured to hold the battery and a mechanical stress/strain sensor between the pair of opposed plates.

14. The computer readable medium of claim 13 wherein the SOH relationship data includes the relationship between peak stress/strain and SOH of the battery.

15. The computer readable medium of claim 13 wherein the SOH relationship data is represented by a linear approximation or non-linear approximation.

16. The computer readable medium of claim 13 wherein a state of charge (SOC) of the battery is determined based on the measured stress/strain, the SOH of the battery and previously stored SOC relationship data for the battery.

17. The computer readable medium of claim 16 wherein the SOC relationship data includes the relationship between measured stress/strain, SOC and SOH.

18. The computer readable medium of claim 16 wherein the SOC relationship data may be represented by a linear approximation or non-linear approximation.

* * * * *